US012768876B1

(12) United States Patent
Tsironis

(10) Patent No.: US 12,768,876 B1

(45) Date of Patent: Oct. 20, 2026

(54) LOAD PULL TUNER WITH INTEGRATED ON-WAFER PLANARITY CONTROL

(71) Applicant: Christos Tsironis, St-Laurent (CA)

(72) Inventor: Christos Tsironis, Kirkland (CA)

(*) Notice: Subject to any disclaimer, the term of this patent is extended or adjusted under 35 U.S.C. 154(b) by 196 days.

(21) Appl. No.: 18/244,436

(22) Filed: Sep. 11, 2023

(51) Int. Cl.

| | |
|---|---|
| ***G01R 31/28*** | (2006.01) |
| ***G01R 1/04*** | (2006.01) |
| ***G01R 1/067*** | (2006.01) |
| ***G01R 27/32*** | (2006.01) |

(52) U.S. Cl.

CPC ....... *G01R 31/2822* (2013.01); *G01R 1/0416* (2013.01); *G01R 1/06772* (2013.01); *G01R 27/32* (2013.01)

(58) Field of Classification Search

CPC .. G01R 27/32; G01R 1/0416; G01R 1/06772; G01R 31/2822; G01R 31/2891

See application file for complete search history.

(56) References Cited

U.S. PATENT DOCUMENTS

| | | | | |
|---|---|---|---|---|
| 8,933,707 B1 * | 1/2015 | Tsironis | ............. | G01R 31/2831 324/207.13 |
| 9,335,345 B1 * | 5/2016 | Tsironis | ............. | G01R 1/06705 |
| 9,653,332 B1 | 5/2017 | Tsironis | | |
| 10,686,239 B1 * | 6/2020 | Tsironis | .................. | H03J 7/305 |
| 11,002,762 B1 * | 5/2021 | Tsironis | ............. | G01R 1/06772 |
| 2003/0132759 A1 * | 7/2003 | Tsironis | ............. | G01R 1/06772 324/601 |

OTHER PUBLICATIONS

"Load Pull" [online] Wikipedia, [Retrieved on Aug. 24, 2017]. Retrieved from Internet <URL: https://en.wikipedia.org/wiki/Load_pull>.

"Computer Controlled Microwave Tuner—CCMT", Product Note 41, Focus Microwaves Inc., Jan. 1998.

"On Wafer Load Pull Tuner Setups: A Design Help", Application Note 48, Focus Microwaves, Dec. 2001, p. 2 ff., Figure 2.

"ACP40-GSG-xxx Probes", Brochure PN 153-231-B [online], FormFactor [Retrieved on Apr. 14, 2021]. Retrieved from Internet <URL:https://formfactor.com /download/acp-quick-guide/?/wpdmdl=3524&refresh=60764fb91b8a31618366393)>.

Load Pull Characterization, White Paper #64, Focus Microwaves Inc., Chapter 2, pp. 13-15, Chapter 9, pp. 43-49.

* cited by examiner

*Primary Examiner* — Lee E Rodak
*Assistant Examiner* — Jeremiah J Barron

(57) ABSTRACT

Planarity adjustment of RF microprobes in a load pull setup on wafer, using a low-profile impedance tuner that is mounted on a 3-axis tuner positioner under an angle matching the angle of the wafer probe is performed using a separation of the tuning module from the tuner housing and allowing it to rotate around an axis through the tips of the wafer microprobe. This renders the directly connected tuner autonomous and compatible with all existing probe stations.

4 Claims, 10 Drawing Sheets

FIG. 1: Prior art

FIG. 2: Prior art

FIG. 3: Prior art

FIG. 4: Prior art

FIG. 5: Prior art

FIG. 6A: Prior art

FIG. 6B: Prior art

FIG. 7: Prior art

LOAD PULL TUNER WITH INTEGRATED ON-WAFER PLANARITY CONTROL

PRIORITY CLAIM

Not applicable.

CROSS-REFERENCE TO RELATED ARTICLES

1. “Load Pull” [online] Wikipedia, [Retrieved on 2017 Aug. 24]. Retrieved from Internet <wikipedia.org/wiki/Load_pull>
2. “Computer Controlled Microwave Tuner, CCMT”, Product Note 41, Focus Microwaves Inc. 1998, pages 2-4.
3. “On Wafer Load Pull Tuner Setups: A Design Help”, Application Note 48, Focus Microwaves, December 2001, page 2 ff., FIG. 2.
4. “ACP40-GSG-xxx Probes”, Brochure PN 153-231-B [online], FormFactor [Retrieved on 2021 Apr. 14]. Retrieved from Internet <formfactor.com/download/acp-quick-guide/?/wpdmdl=3524&refresh=60764fb91b8a31618366393)>.
5. Load Pull Characterization, White Paper #64, Focus Microwaves Inc., Chapter 2, pp. 13-15, Chapter 9, pp. 43-49.
6. Tsironis, C. U.S. Pat. No. 10,686,239, “Slide screw tuners with offset tuning probes and method”, FIGS. 10, 12.
7. Tsironis, C. U.S. Pat. No. 9,335,345, “A Method for Planarity Alignment of Waveguide Wafer Probes”.
8. Tsironis, C. U.S. Pat. No. 9,653,332, “Wafer probe holder for planarity and orientation adjustment”, FIGS. 3 and 8.

BACKGROUND OF THE INVENTION

Modern design of low noise and high-power RF amplifiers used in various tele communication systems, requires accurate knowledge of the active device’s (DUT, transistor) characteristics. In such circuits, it is insufficient for the DUT, which operate in their low noise or highly non-linear regime, close to power saturation, to be described using noise or non-linear numeric models only. This invention relates to load and source pull testing (see ref. 1) of low noise and medium and high-power RF transistor and amplifier chips on semiconductor wafers using remotely controlled electro-mechanical impedance tuners (see ref. 2).

A popular method for testing and characterizing such high-power microwave and Millimeter-Wave transistors (DUT, device under test) is “load pull” (FIG. 1). Low noise transistors are tested using “source pull”. Load or source pull are measurement techniques employing impedance tuners 2, 4 and other test equipment, such as signal or noise sources 1, test fixtures for housing a DUT 3, and power meters or low noise receivers 5 to measure the extracted signal power or the noise figure, the whole controlled by a computer 6; the computer controls and communicates with the tuners 2, 4 and the other equipment 1, 5 using digital cables 7, 8, 9. The tuners are used in order to manipulate the microwave impedance conditions in a systematic and controlled manner under which the DUT is tested (see ref. 1); impedance tuners allow determining the optimum impedance conditions for designing amplifiers and other microwave components for specific performance targets, such as noise figure, gain, efficiency, inter-modulation etc., using packaged transistors in test fixtures or chip semiconductor devices on-wafer (see ref. 3). To connect the test equipment with the on-wafer chips one uses cables and RF wafer microprobes (FIG. 4). The microprobes comprise a support body and a coaxial connector giving RF signal access to the microscopic probe tips; the, typically, three probe tips must be aligned and oriented exactly parallel (planarized) to the semiconductor wafer to create equal marks on the chip terminal plots (FIG. 6A). The support body of the microprobes has an inclined rotation axis in line with the probe tips (FIG. 4) and the RF connector; to planarize the probe tips the whole body of the microprobe and the probe tips must be rotated around this axis; if the microprobe is connected to external equipment (tuners), this is only possible if a flexible (and lossy) RF cable is used between the equipment and the coaxial connector of the microprobe to absorb the angle change which reaches typically up to +/−5 degrees and does not exceed +/−10 degrees.

The insertion loss of the RF links 10, 11 between the tuners and the DUT (using test fixtures or, in on-wafer testing the DUT are accessed using wafer microprobes, see ref. 4), reduces dramatically the intrinsic tuning range of the tuners 22 to the tuning range of the system 23. This prevents reaching optimum matching conditions 21 or 20 (FIG. 2). To minimize the insertion loss 10, 11, the RF cables (FIG. 3) must be eliminated by connecting the tuner’s test ports directly to the wafer microprobe (FIG. 8). At the level of the probe tips, to establish reliable contact with the DUT chip, the wafer microprobe must be aligned and planarized by rotating it together with the attached to it tuner and adjust the misalignment angle THETA (Θ) to zero (FIGS. 6A and 6B and ref. 8).

BRIEF SUMMARY OF THE INVENTION

The invention consists in incorporating the planarity control mechanism of a wafer microprobe inside a slide screw (load pull) impedance tuner, which can then be directly connected to the RF wafer microprobe and establish the planarity of the three or four tips of wafer probe (FIG. 6B) using a simple arrangement. Prior to the extended slabline tuner technology (see ref. 6), the method used when the tuner test port is far from the wafer probe, employed either a flexible RF cable (FIGS. 3 and 5) and a local rotation mechanism (FIG. 5) or a cumbersome ambitious rotation mechanism rotating the whole tuner body 70 (FIG. 7) on an arc 76 around a center 71; in the present invention the offset distance between the probe tip plan and the rotation axis of the tuning module inside the tuner housing is kept to a minimum (FIG. 9) allowing for a simple, integrated and compact solution.

BRIEF DESCRIPTION OF THE SEVERAL VIEWS OF THE DRAWINGS

The invention and its mode of operation will be more clearly understood from the following detailed description, when read with the appended drawings in which:

FIG. 6A depicts the probe tip marks on the chip connection pads; FIG. 6B depicts a front view of the probe tips and definition of planarity angle THETA.

DETAILED DESCRIPTION OF THE INVENTION

Figure 1:
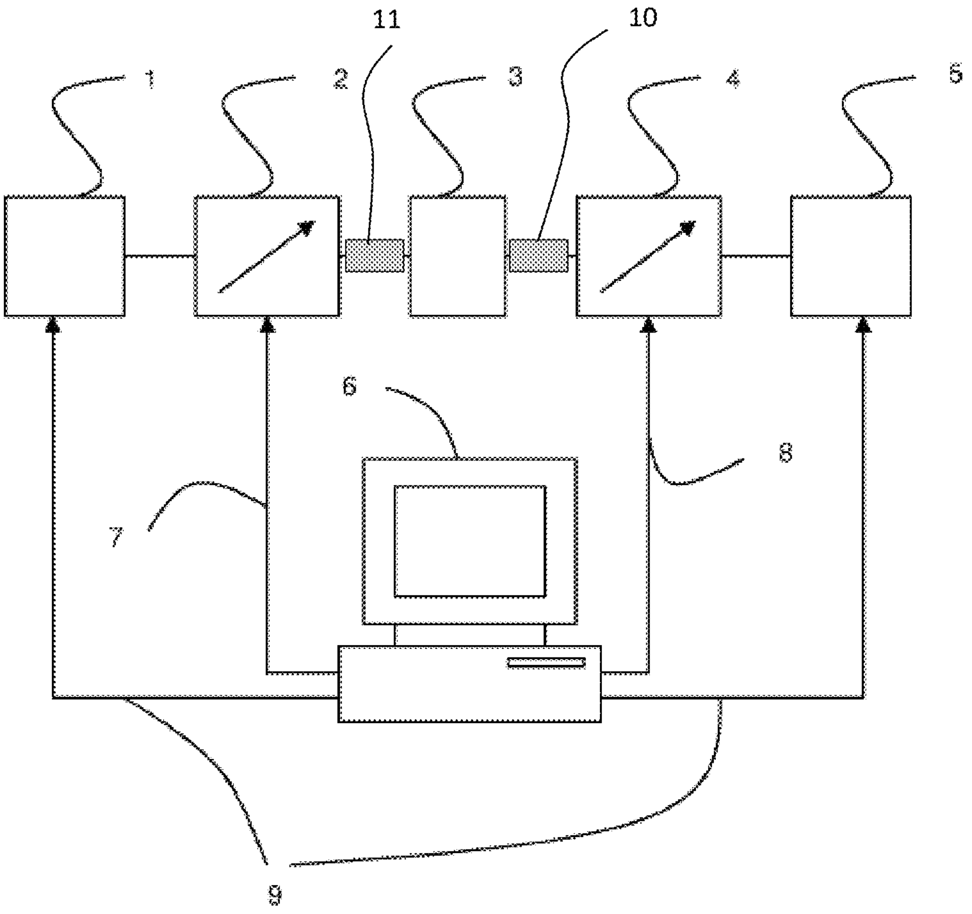
FIG. 1 depicts prior art, a typical automated transistor source and load pull test system.
Figure 4:
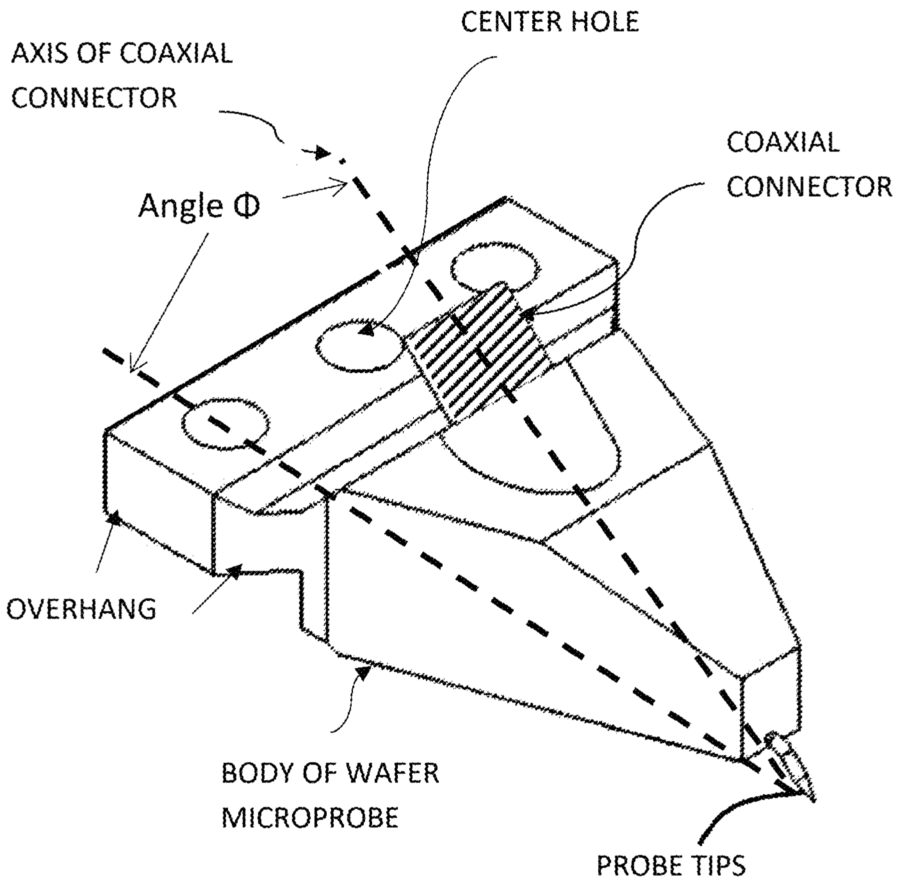
FIG. 4 depicts prior art, a perspective view of a commercially available RF wafer microprobe.
Figure 6:
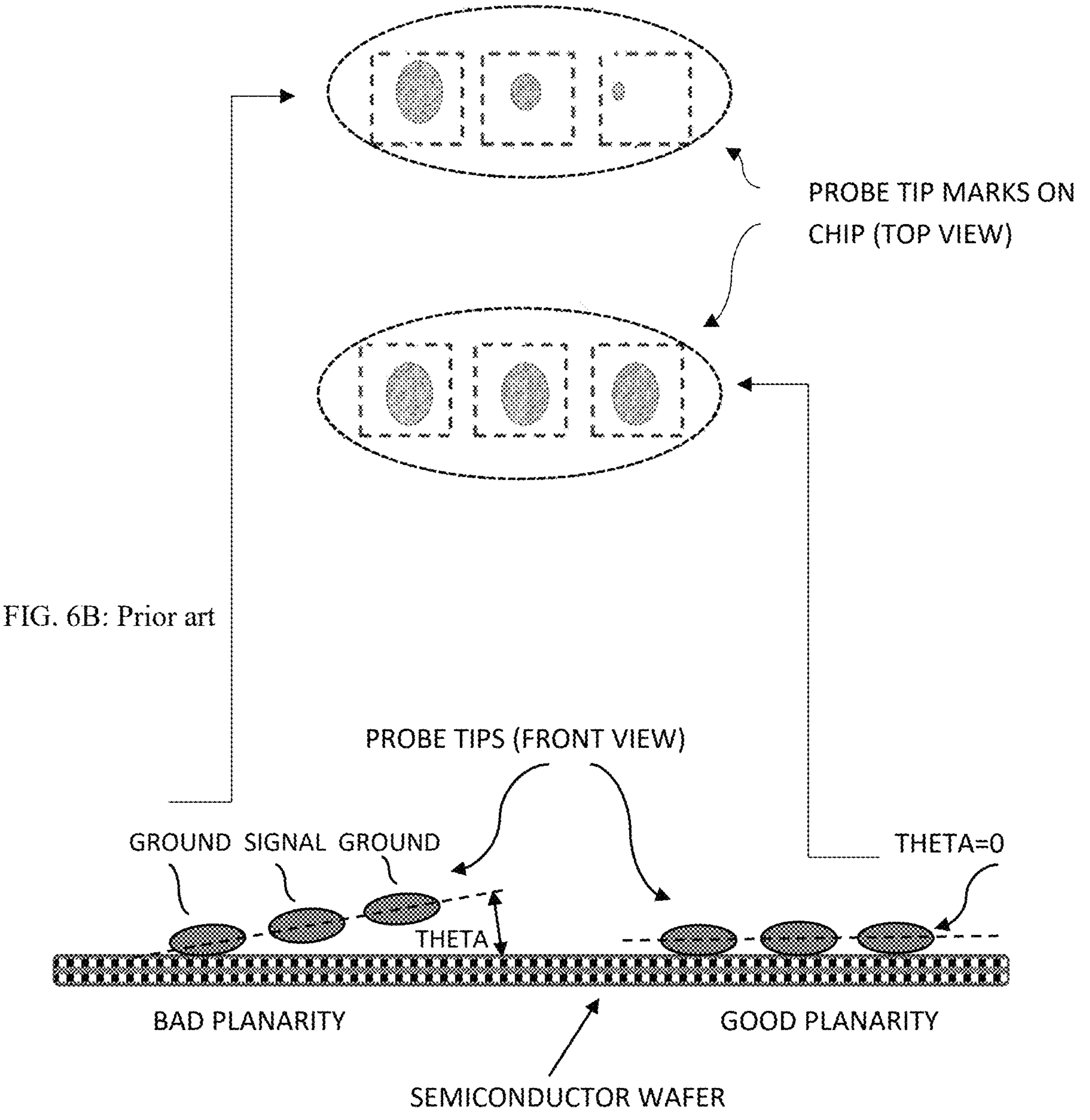
FIGS. 6A through 6B depict prior art, a magnified view of the contact tips of a wafer microprobe as a function of planarity status.

The load pull system (FIG. 1) requires at least one impedance tuner 4 or 2 to be connected to the DUT 3 in order to manipulate the source and/or load impedance. The DUT (typically a chip on a semiconductor wafer) is accessible through wafer microprobes (FIG. 4). The wafer microprobes have a coaxial connector leading directly and with minimum insertion loss, using a short, microscopic (≤1 mm), coplanar waveguide or coaxial cable, to coplanar probe tips (FIG. 6A, 6B). The angle @ between the axis of the coaxial connector and the bottom plane of the body of the wafer probe is a characteristic quantity of the probe. There are wafer microprobes with Φ equal 30, 45 or 90 degrees (see ref. 4); this invention deals with 30- and 45-degree probes, to be able to tilt the tuners to match the microprobe connector axis.

Figure 2:
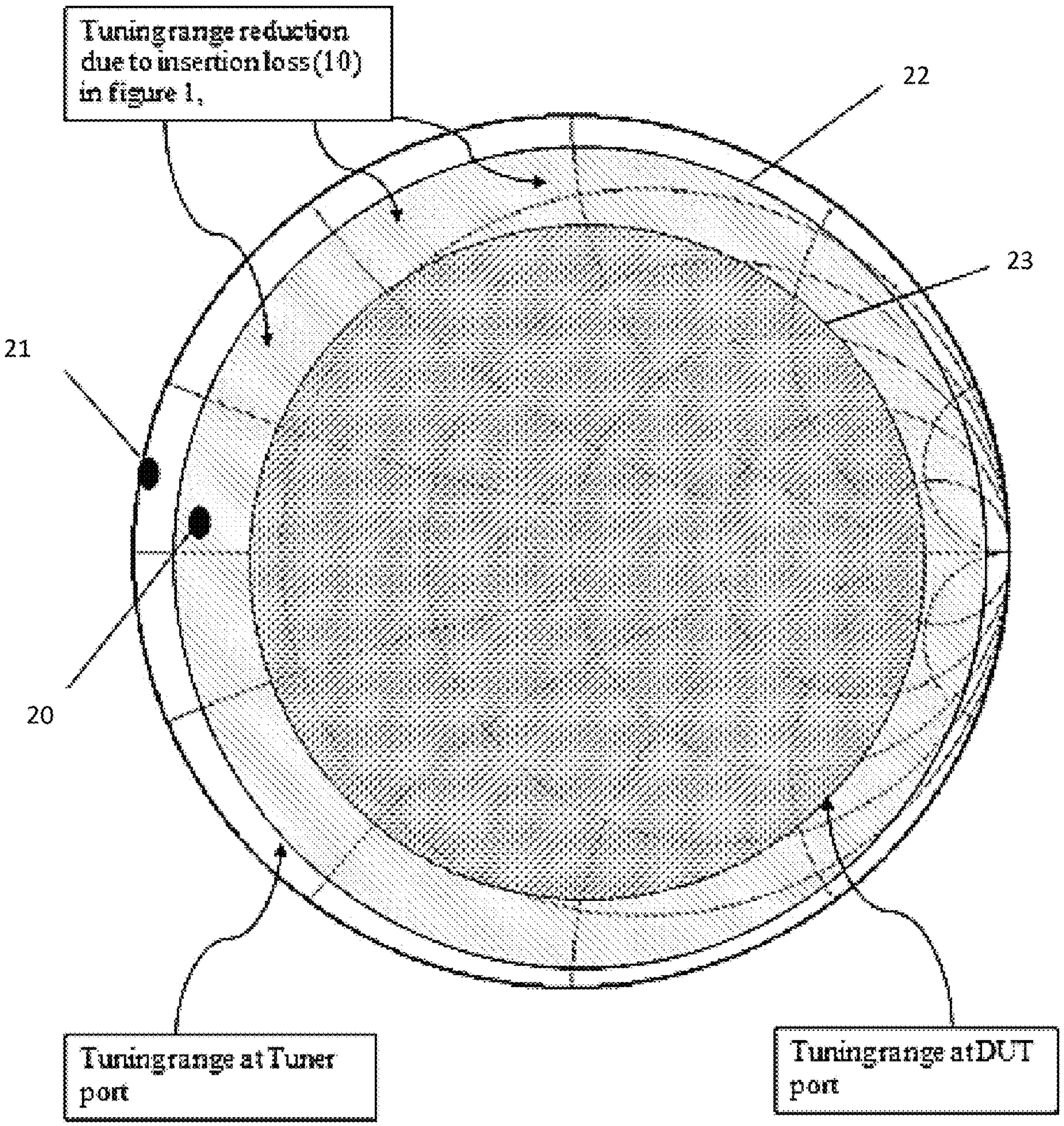
FIG. 2 depicts prior art, effect of insertion loss between tuner and DUT on reducing the tuning range at DUT reference plane.
Figure 3:
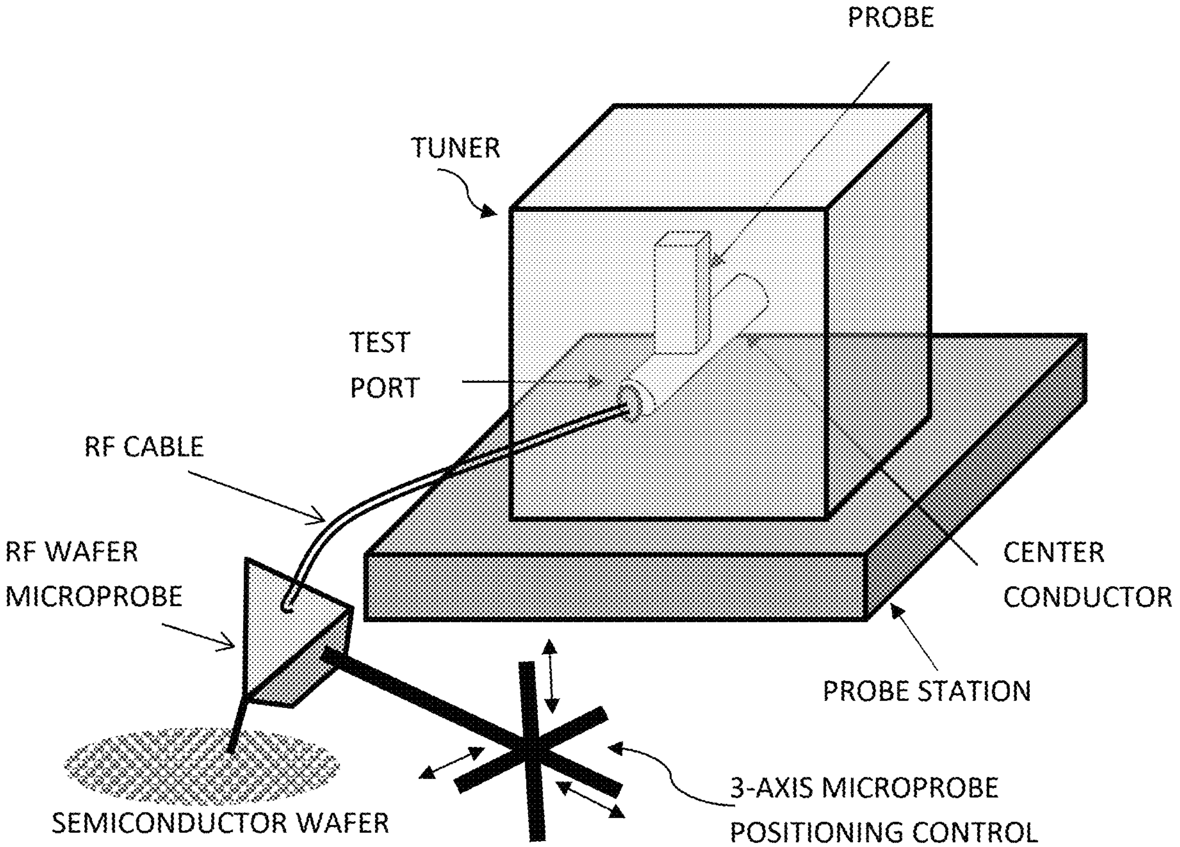
FIG. 3 depicts prior art, schematic view of RF wafer microprobe connected with a load pull tuner using a RF cable and associated items.
Figure 9:
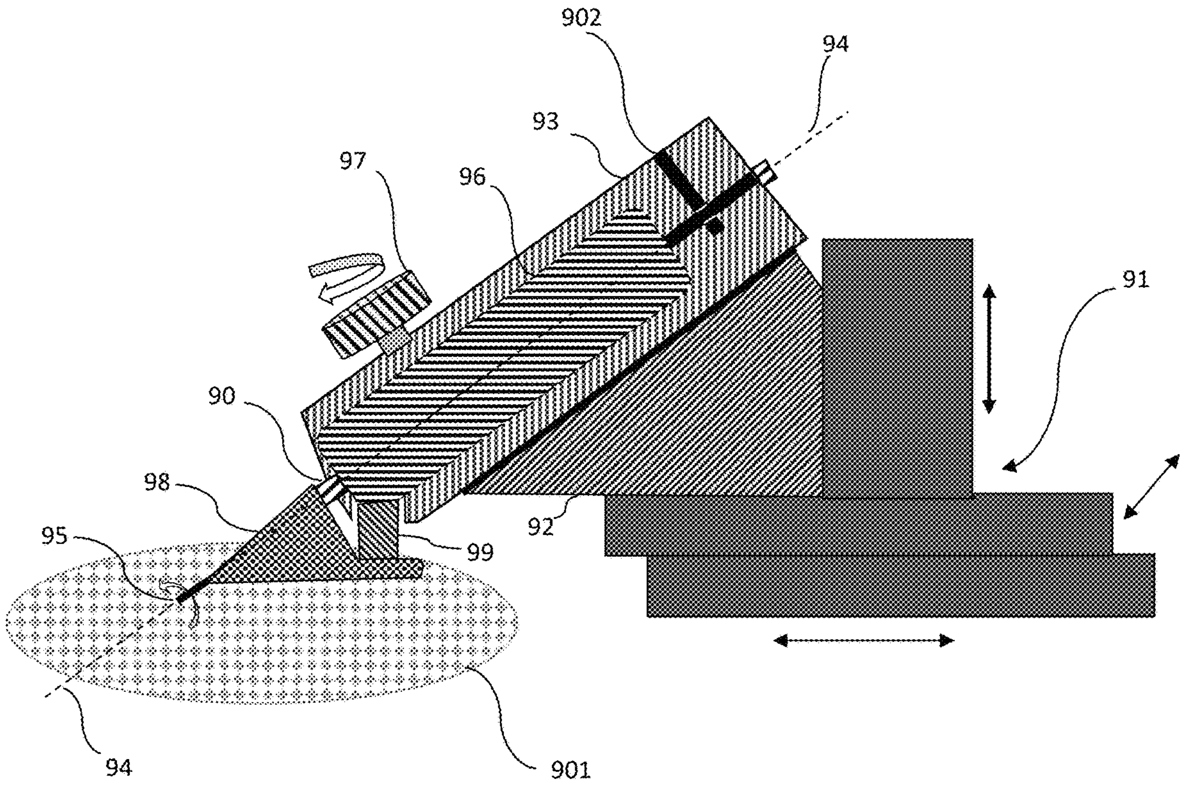
FIG. 9 depicts a planarity control mechanism for an assembly including a low-profile tuner attached to an RF microprobe, when the probe tips, the probe coaxial connector and the slabline center conductor are aligned on the same axis (they form the straight line 94).

Insertion loss 10, 11 of the connection paths between the tuners 4, 2 and the DUT 3 (FIG. 1) reduce the original tuning range 22 at the tuner reference plane to the effective tuning range 23 at the DUT reference plane (FIG. 2). The result is that a typical internal impedance 20 of the DUT cannot be conjugate matched, except if the insertion loss 10, 11 is minimized and the tuning range 23 is expanded towards the tuning range 22. In extreme cases, DUT with internal impedance 21 close to the limit of the Smith chart cannot be matched at all using passive tuners, instead requiring active tuning (see ref. 5). To reach a tuning range close to 22 using a passive tuner, one has to minimize all insertion loss 10, 11 and place the internal tuning probe of the tuner as close to the tuner test port 90 as possible (see ref. 6). This is possible if the tuner test port is aligned and directly connected to the wafer microprobe (FIG. 9).

In hitherto art (FIG. 12 of ref. 6) the wafer microprobe was connected to the tuner test port by simply screwing and tightening the coaxial connector of the RF microprobe to the tuner test port adapter and aligned using some supporting alignment tool (FIGS. 5 and 7 in ref. 7) to planarize (adjust the angle THETA) the wafer probes, as shown in FIGS. 6A and 6B. This planarity adjustment method is obviously based on personal feeling, experience and trial and error, since tightening the coaxial connectors by hand may inadvertently change the final state of the angle THETA. The correct approach should be to adjust and fix the planarity of the wafer-probe base after tightening the test port connector.

Figure 7:
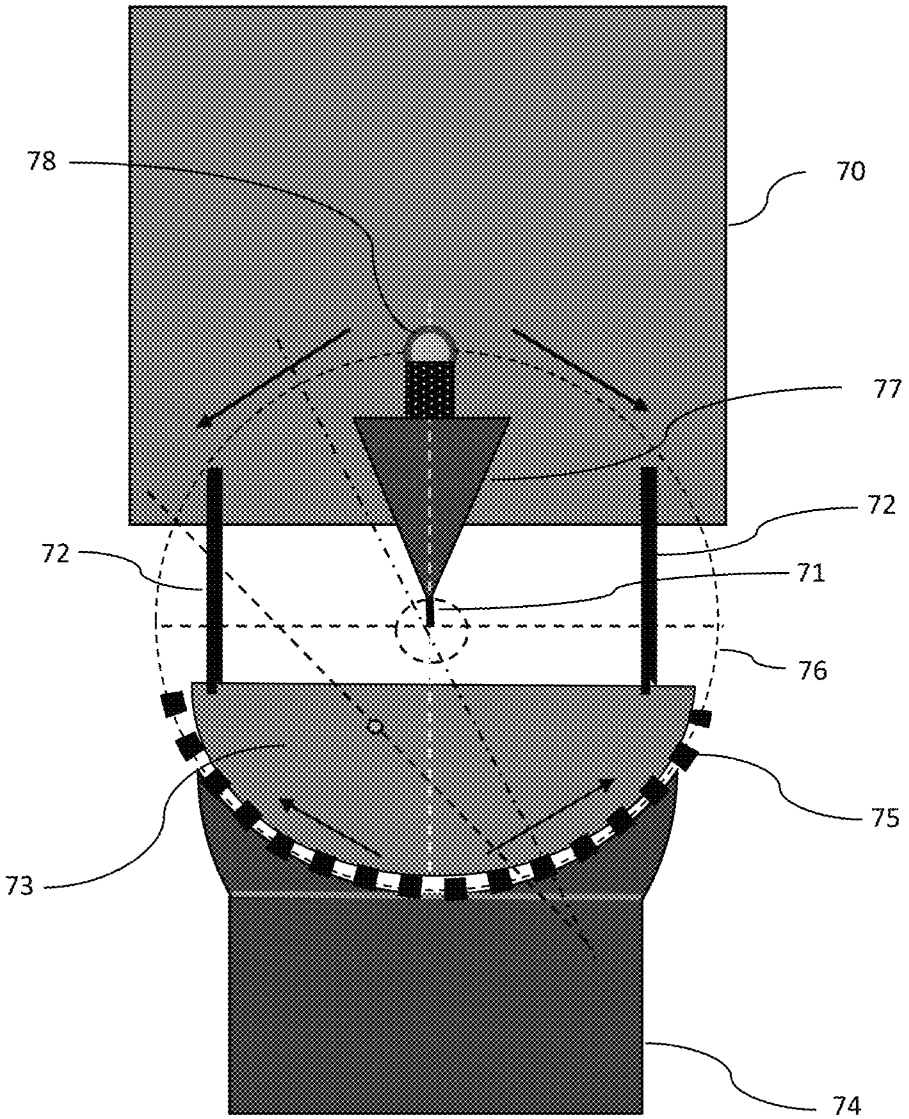
FIG. 7 depicts prior art, a probe planarity adjustment mechanism using a section of a large circular bearing allowing to rotate the entire tuner around the probe tips.

An other prior art embodiment for allowing the entire tuner 70 to rotate around the axis of the microprobe tips 71 is shown in FIG. 7: a set of posts 72 holds the tuner body 70 on top of a semi cylinder 73, which is embedded into a semicylindrical body 74 and glides (rotates) using high precision roller bearings 75; if the center of the rotation trajectory 76 coincides with the probe tips 71, then the tuner 70 and the microprobe 77 attached to it does rotate around the probe tips 71. This, more complex solution, permits the probe tips 71 not to be on the same axis as the center conductor 78 of the tuner slabline. This embodiment provides an acceptable technical solution to the planarization issue but requires specific external items 73, 74, 75 and associated supporting assemblies that must be added to the 3-axis tuner positioner and the probe station, since it does not offer a universal solution, because it is expensive, and the tuner is not autonomous.

Figure 5:
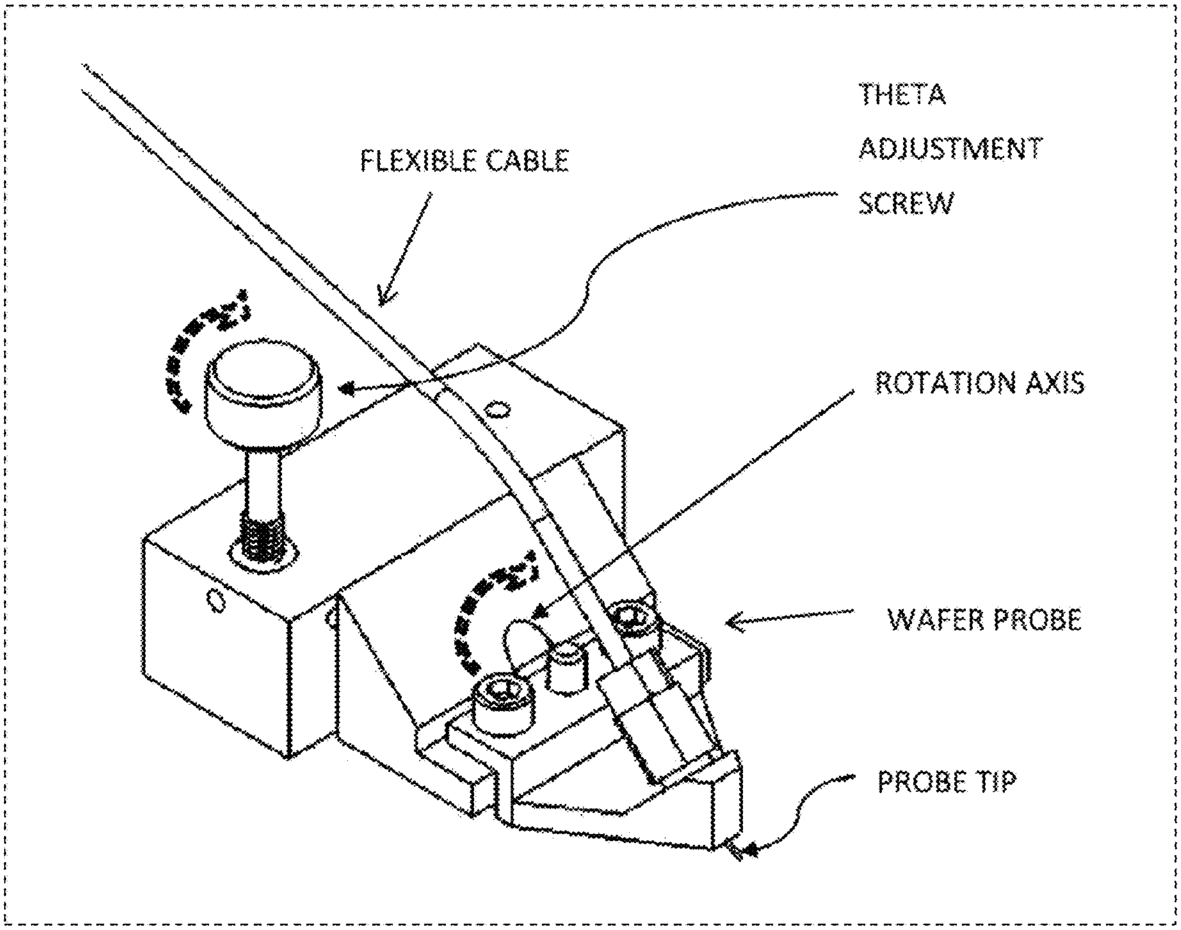
FIG. 5 depicts prior art, a commercially available THETA control mechanism of a microprobe linked with the auxiliary equipment using a lossy flexible or semi-rigid RF cable.
Figure 8:
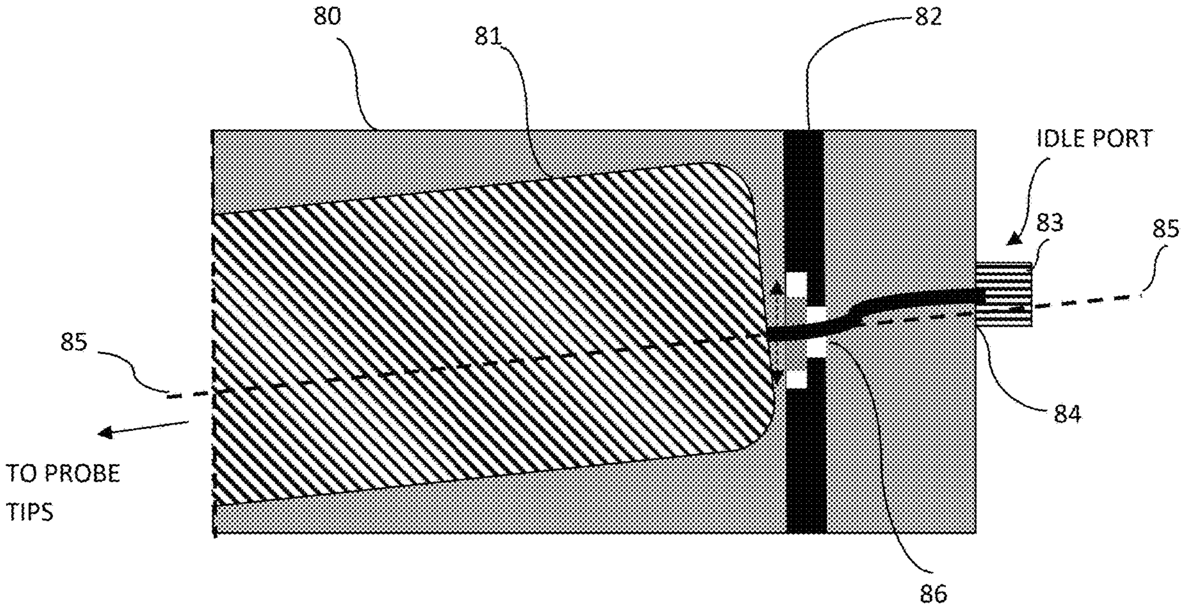
FIG. 8 depicts a detailed view of a low-profile tuner rotational support 82 where the RF microprobe tips are not aligned with the output coaxial connector 83 (idle port).

FIG. 8 depicts a detail of a configuration, where the probe tips and the output (idle port) connector 83 of the tuner 80 is not on the same axis 85 as is also the case for the prior art assembly of FIG. 5. In this case the tuning module 81 is tilted inside the tuner housing, allowed using a flexible RF cable extension 84, to adapt its rotation axis 85 (including the slabline, 100) and is held in place by a perpendicular post 82 anchored and guided inside the tuner enclosure allowing slide fitting 86 rotation in line with the rotation axis of the probe tips. This allows the tuner body 80 to be mounted on any probe station 91 under the built-in angle @ of the microprobe using a standard support block adapter 92 making the solution universal.

FIG. 9 depicts the conceptual layout of a prior art low-profile tuner of ref. 6: In this case the tuning probes of the tuner are held by an extension bracket and brought as close to the test port coaxial connector 90 of the tuners as mechanically possible. For this the slotted airline (slabline, see ref. 6) of the tuner 93, including the center conductor, is mounted in the tuner control structure protruding towards the DUT and the tuner is mounted under an angle on the 3-axis tuner positioner 91 using a pyramidal angled adapter 92. This way the insertion loss inside the tuner, between the tuning probe and the test port is significantly reduced. The geometrical rotation axis 94 of the microprobe tips 95, defined also using the supporting stab 902, traverses the tuning module 96 inside the tuner housing 93 and the knob 97 controls THETA.

The body 98 of the microprobe is attached to the bottom of the tuning module 96 using a fitting adapter 99 for well-defined mechanical stability and rotation around the axis of the probe tips (FIG. 6B). By rotating the tuning module 96 around the axis 94 also rotates the tips 95 of the microprobe (FIG. 6B) and adjusts the angle THETA to reach homogenous tip contacting (FIG. 6A) with the semiconductor wafer 901, which said adjustment is called "planarizing".

Figure 10:
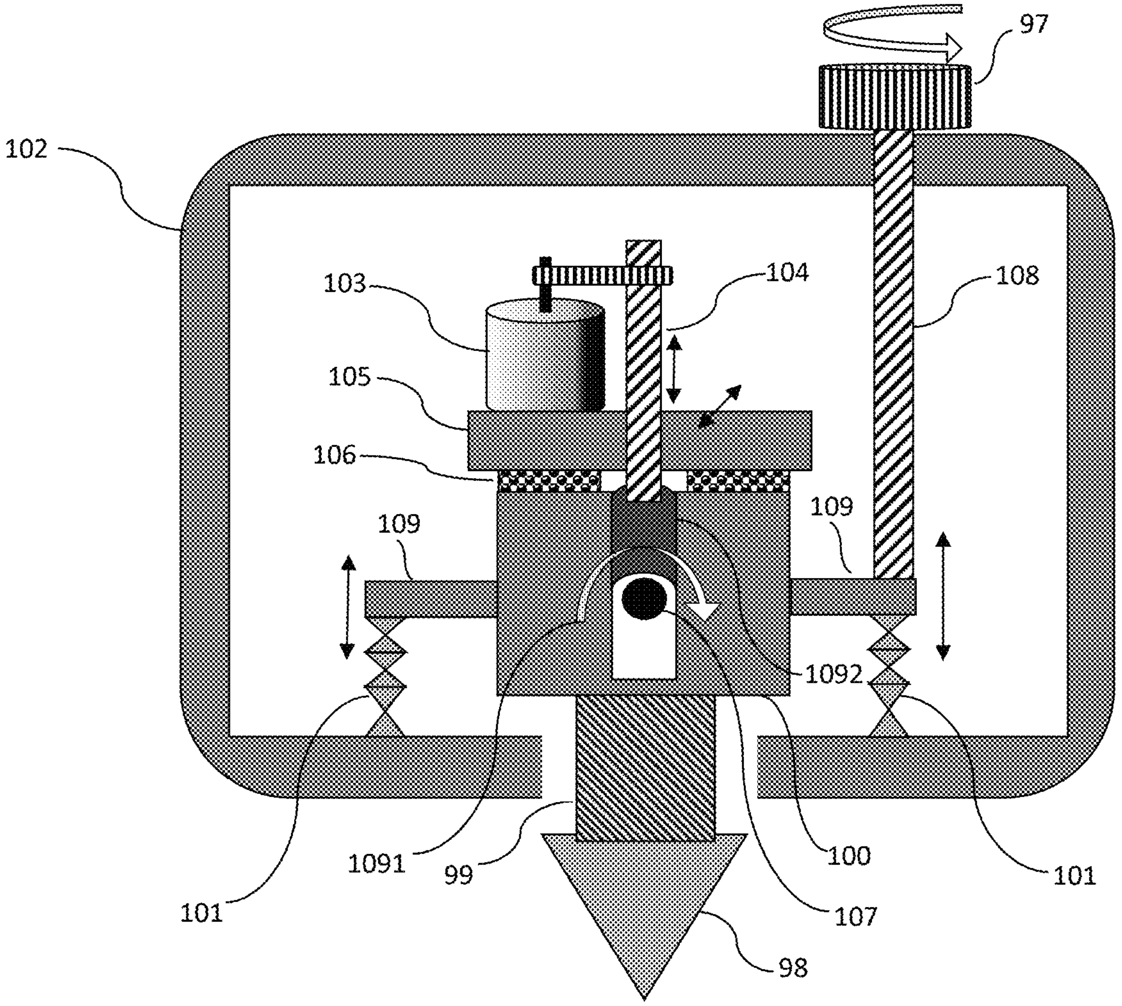
FIG. 10 depicts a cross section of the tuning module rotating inside the tuner housing.

The planarization mechanism is better understood through the cross section of FIG. 10: the slabline 100, which is the core of the tuning module 96 is anchored to the base of the tuner housing 102 using guided springs 101, which allow the whole tuning module mechanism including the slabline 100, the stepper motor 103, the carriage 105, the vertical axis mechanism 104 and the control mechanism comprising flaps 109 and screw 108, to rotate (tilt) 1091 around the center conductor 107 and the tuning probe 1092 by a small angle of no more than +/−10 degrees, pushed or pulled vertically by the screw 108 controlled manually by knob 97. The carriage 105 slides along the slabline 100 using another motor and ACME gear (not shown) on appropriate linear sliders 106. Power supply and digital control of the stepper motors 103 associated with the carriage 105, and tuning probe 1092 control is provided using flexible biasing and digital control cables which can tolerate the rotation.

Obvious alternative embodiments to the herein disclosed integrated solution, incorporated in slide-screw load pull tuners directly connected to wafer microprobes, have been reported before, but none renders the tuner autonomous, i.e., integrable without alterations on any commercial probe station but shall not impede on the validity of the basic idea of the present invention.

What is claimed is:

1. A load pull tuner incorporating a tuning module and a control mechanism for the planarity of auxiliary wafer microprobes directly connected to the tuning module, wherein the load pull tuner has an enclosure that houses the tuning module, and wherein the auxiliary wafer microprobes comprise a body, probe tips and a coaxial connector, and wherein the tuning module comprises:

a slabline with a center conductor linking a test port with an idle port, each said port being equipped with a coaxial connector, and at least one remotely controlled carriage moving along the slabline and holding a tuning probe remotely insertable into and movable along the slabline;

the load pull tuner further includes the planarity control mechanism configured to control the planarity of the auxiliary wafer microprobes, which said planarity control mechanism is mounted perpendicular to the slabline and controls a rotation of the tuning module, and wherein the coaxial connector of the auxiliary wafer microprobes and the coaxial connector of the test port of the slabline are aligned and directly connected, and wherein the tuning module can be rotated around a rotation axis through the probe tips of the auxiliary wafer microprobes.

2. The load pull tuner of claim 1, wherein the control mechanism for the planarity of the auxiliary wafer microprobes controls the angle of the tuning module by at least +/−5 degrees around the common rotation axis by means of a rotation of the slabline around its center conductor effectuated by two horizontal side flaps of the slabline, a left-side flap and a right-side flap, said side flaps being connected to the tuner enclosure using compression-expansion springs anchoring the tuning module to the tuner enclosure, and by a manually adjustable screw pushing vertically one side-flap and controlling the rotation of the slabline and the associated planarity angle of the auxiliary wafer microprobes.

3. The load pull tuner of claim 1, further comprising a device for attaching the body of the auxiliary wafer microprobes to the tuning module consisting of a fitting adapter ensuring that the rotation through the probe tips matches the rotation of the tuning module.

4. The load pull tuner of claim 3: wherein the fitting adapter is configured to be attached to the body of the auxiliary wafer microprobes and to the slabline of the tuning module.

* * * * *